(12) United States Patent
Takeuchi

(10) Patent No.: US 8,610,973 B2
(45) Date of Patent: Dec. 17, 2013

(54) IMAGE READING APPARATUS AND MULTILAYER SUBSTRATE

(75) Inventor: Hideo Takeuchi, Ebina (JP)

(73) Assignee: Fuji Xerox Co., Ltd., Kanagawa (JP)

( * ) Notice: Subject to any disclaimer, the term of this patent is extended or adjusted under 35 U.S.C. 154(b) by 677 days.

(21) Appl. No.: 12/782,355

(22) Filed: May 18, 2010

(65) Prior Publication Data

US 2011/0012134 A1   Jan. 20, 2011

(30) Foreign Application Priority Data

Jul. 17, 2009   (JP) ................. 2009-169416

(51) Int. Cl.
*H04N 1/04*   (2006.01)
*H04N 1/46*   (2006.01)

(52) U.S. Cl.
USPC ................. 358/494; 358/474; 358/505

(58) Field of Classification Search
None
See application file for complete search history.

(56) References Cited

U.S. PATENT DOCUMENTS

2008/0247703 A1 *  10/2008  Kodama et al. ................. 385/14

FOREIGN PATENT DOCUMENTS

| JP | 10 226107 | 8/1998 |
|---|---|---|
| JP | 2001-242561 A | 9/2001 |
| JP | 2005 070463 A | 3/2005 |
| JP | 2007 096285 A | 4/2007 |
| JP | 2008 229925 A | 10/2008 |
| JP | 2009 018455 A | 1/2009 |
| WO | WO 2009110394 A1 * | 9/2009 |

OTHER PUBLICATIONS

Japanese Office Action dated Mar. 19, 2013 issued in JP Patent Application No. 2009-169416.

* cited by examiner

*Primary Examiner* — Thierry L Pham
(74) *Attorney, Agent, or Firm* — Sughrue Mion, PLLC

(57) ABSTRACT

An image reading apparatus includes a light source that irradiates a document with light, the light source including a multilayer substrate and light emitting elements linearly arranged on a first surface of the multilayer substrate; and a light receiver that receives reflected light reflected from the document. The multilayer substrate has at least a pair of through holes each having an inner surface on which a reinforcement member is formed, the at least a pair of through holes being formed so that one of the light emitting elements is interposed therebetween. The reinforcement members contact wiring formed on the first surface of the multilayer substrate and wiring formed on a second surface of the multilayer substrate opposite the first surface.

7 Claims, 6 Drawing Sheets

… (US 8,610,973 B2)

IMAGE READING APPARATUS AND MULTILAYER SUBSTRATE

CROSS-REFERENCE TO RELATED APPLICATIONS

This application is based on and claims priority under 35 USC 119 from Japanese Patent Application No. 2009-169416 filed Jul. 17, 2009.

BACKGROUND (i) Technical Field

The present invention relates to an image reading apparatus and a multilayer substrate.

(ii) Related Art

Image reading apparatuses that automatically read image data of a document are used as copiers, facsimile machines, and scanners for inputting image data to computers. Such image reading apparatuses read an image of a document by irradiating the document with light using a light source that extends in a direction perpendicular to a transportation path of the document and by receiving reflected light reflected from the document by using image sensors.

SUMMARY

According to an aspect of the invention, there is provided an image reading apparatus including a light source that irradiates a document with light, the light source including a multilayer substrate, and light emitting elements linearly arranged on a first surface of the multilayer substrate; and a light receiver that receives reflected light reflected from the document, wherein the multilayer substrate has at least a pair of through holes each having an inner surface on which a reinforcement member is formed, the at least a pair of through holes being formed so that one of the light emitting elements is interposed therebetween, and wherein the reinforcement members contact wiring formed on the first surface of the multilayer substrate and wiring formed on a second surface of the multilayer substrate opposite the first surface.

BRIEF DESCRIPTION OF THE DRAWINGS

Exemplary embodiments of the present invention will be described in detail based on the following figures, wherein.

DETAILED DESCRIPTION

<Description of the Entire Image Reading Apparatus>

Hereinafter, an exemplary embodiment of the present invention will be described with reference to the attached drawings.

Figure 1:
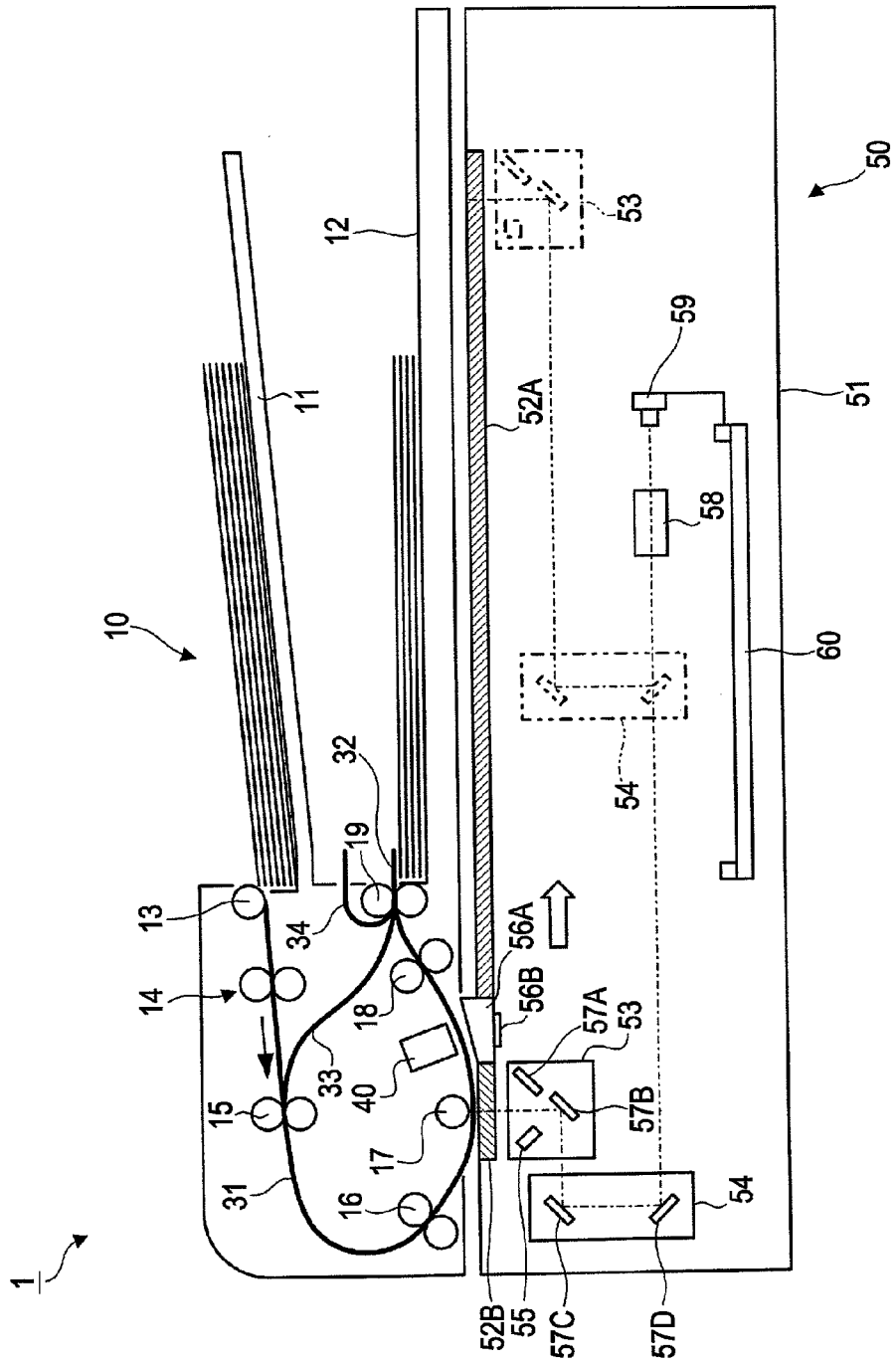
FIG. 1 illustrates an image reading apparatus according to an exemplary embodiment.

FIG. 1 illustrates an image reading apparatus 1 according to an exemplary embodiment. The image reading apparatus 1 illustrated in FIG. 1 can read an image of a document that is fixed and an image of a document that is being transported. The image reading apparatus 1 includes a document feeder 10 that successively transports a document from a stack of documents and a reader 50 that reads an image by scanning the document.

The document feeder 10 includes a document tray 11 that holds a stack of documents and an output tray 12 that holds documents whose images have been read. The output tray 12 is disposed below the document tray 11. The document feeder 10 includes a document transport roller 13 that picks up a document from the document tray 11 and transports the document. A separation mechanism 14 is disposed downstream of the document transport roller 13 in the direction in which the document is transported. The separation mechanism 14 separates the documents into individual sheets by using a feed roller and a retard roller. On a first transport path 31 along which a document is transported, pre-registration rollers 15, registration rollers 16, a platen roller 17, and out rollers 18 are sequentially disposed from upstream to downstream in the direction in which the document is transported. A contact image sensor (CIS) unit 40 is disposed in the document feeder 10.

The pre-registration rollers 15 transport a sheet of document that has been separated toward the rollers disposed downstream thereof and make the document form a loop. The registration rollers 16 temporarily stop rotating and restart rotating at an appropriate time so as to feed the document toward the reader 50 (described below) while adjusting a registration (displacement). The platen roller 17 assists with transportation of the document while the reader 50 reads the document. The out rollers 18 transport the document, whose image has been read by the reader 50, further downstream. Downstream of the out rollers 18 in the direction in which the document is transported, a second transport path 32 for guiding the document to the output tray 12 is formed. Sheet output rollers 19 are disposed on the second transport path 32.

Moreover, the image reading apparatus 1 has a third transport path 33 between the exit side of the out rollers 18 and the entry side of the pre-registration rollers 15 so that images on both sides of the document can be read in one process. The sheet output rollers 19 have a function of reversing the document to the third transport path 33.

Furthermore, the image reading apparatus 1 has a fourth transport path 34 for, after the images on both sides of the document have been read, reversing the document again and outputting the document to the output tray 12. The fourth transport path 34 is disposed above the second transport path 32. The sheet output rollers 19 also have a function of reversing the document to the fourth transport path 34.

The reader 50 supports the document feeder 10 so that the document feeder 10 can be opened and closed, supports the document feeder 10 with an apparatus frame 51, and reads an image of the document that is being transported by the document feeder 10. The reader 50 includes the apparatus frame 51, which forms a housing, a first platen glass 52A for placing thereon a stationary document whose image to be read, and a second platen glass 52B having a window for reading therethrough a document that is being transported by the document feeder 10. The second platen glass 52B is made of, for example, a long and transparent glass plate.

The reader 50 includes a full-rate carriage 53 and a half-rate carriage 54. The full-rate carriage 53 reads an image while staying still under the second platen glass 52B or while scanning the image over the entire area of the first platen glass 52A. The half-rate carriage 54 supplies light obtained from the full-rate carriage 53 to an image forming section. The full-rate carriage 53 includes a light source 55 that emits light for irradiating a document, a first mirror 57A for reflecting the light from the light source 55 toward the document, and a second mirror 57B for reflecting the light reflected by the document. The half-rate carriage 54 includes a third mirror 57C and a fourth mirror 57D for directing the light reflected by the second mirror 57B toward the image forming section. The reader 50 includes a drive source (not shown), such as a motor, for moving the half-rate carriage 54 and the full-rate carriage 53 including the light source 55 in the sub-scanning direction. The drive source functions as a scanning unit.

The reader 50 further includes an image forming lens 58 and a CCD image sensor 59, which is an example of a light receiver. The image forming lens 58 optically reduces the size of an optical image reflected by the fourth mirror 57D. The CCD image sensor 59 performs photoelectric conversion of an optical image formed by the image forming lens 58. That is, the reader 50 forms an image on the CCD image sensor 59 using a so-called reduction optical system. The reader 50 includes a guide 56A, which is disposed between the first platen glass 52A and the second platen glass 52B. The guide 56A guides a document that is being transported by the document feeder 10. A white reference plate 56B, which extends in the main scanning direction, is attached to the bottom of the guide 56A.

The reader 50 further includes a control and image-processing unit 60. The control and image-processing unit 60 performs predetermined processing on image data input from image sensors (not shown) of the contact image sensor unit 40 and the CCD image sensor 59. The control and image-processing unit 60 controls the units of the image reading apparatus 1 (the document feeder 10, the reader 50, and the contact image sensor unit 40) during reading operation.

Next, the operation of reading a document performed by the image reading apparatus 1 will be described. For example, when reading an image of a document placed on the first platen glass 52A, the full-rate carriage 53 and the half-rate carriage 54 move in a scanning direction (the direction indicated by an arrow) by distances having a ratio of 2:1. The light source 55 of the full-rate carriage 53 emits light toward a surface of the document to be read through the first mirror 57A. Reflected light reflected by the document is reflected by the second mirror 57B.

The reflected light is successively reflected by the third mirror 57C and the fourth mirror 57D, and guided to the image forming lens 58. The light guided to the image forming lens 58 is focused on the CCD image sensor 59. The CCD image sensor 59, which is a one-dimensional sensor, processes one line at a time. When one line is read in the main scanning direction, the full-rate carriage 53 moves in a direction perpendicular to the main scanning direction (sub-scanning direction) and reads the next line of the document. By performing this operation over the entire document, reading of one page of the document is completed.

When reading an image of a document that is being transported by the document feeder 10, the document passes over the second platen glass 52B. At this time, the full-rate carriage 53 and the half-rate carriage 54 are at rest at the positions indicated by the solid lines in FIG. 1. Reflected light reflected by the first line of the document, which has passed the platen roller 17 of the document feeder 10, is successively reflected by the second mirror 57B, the third mirror 57C, and the fourth mirror 57D, and is guided to the image forming lens 58.

The image forming lens 58 focuses the reflected light, and the CCD image sensor 59 reads an image. After the CCD image sensor 59, which is a one-dimensional sensor, has read one line extending in the main scanning direction, the CCD image sensor 59 reads the next line extending in the main scanning direction of the document, which is being transported by the document feeder 10. When the trailing end of the document has passed the reading position of the second platen glass 52B, reading of one page of the document in the sub-scanning direction is completed. In the exemplary embodiment, when the CCD image sensor 59 reads an image on a first side of the document, the contact image sensor unit 40 may read an image on a second side of the document.

<Description of Light Source>

Figure 2:
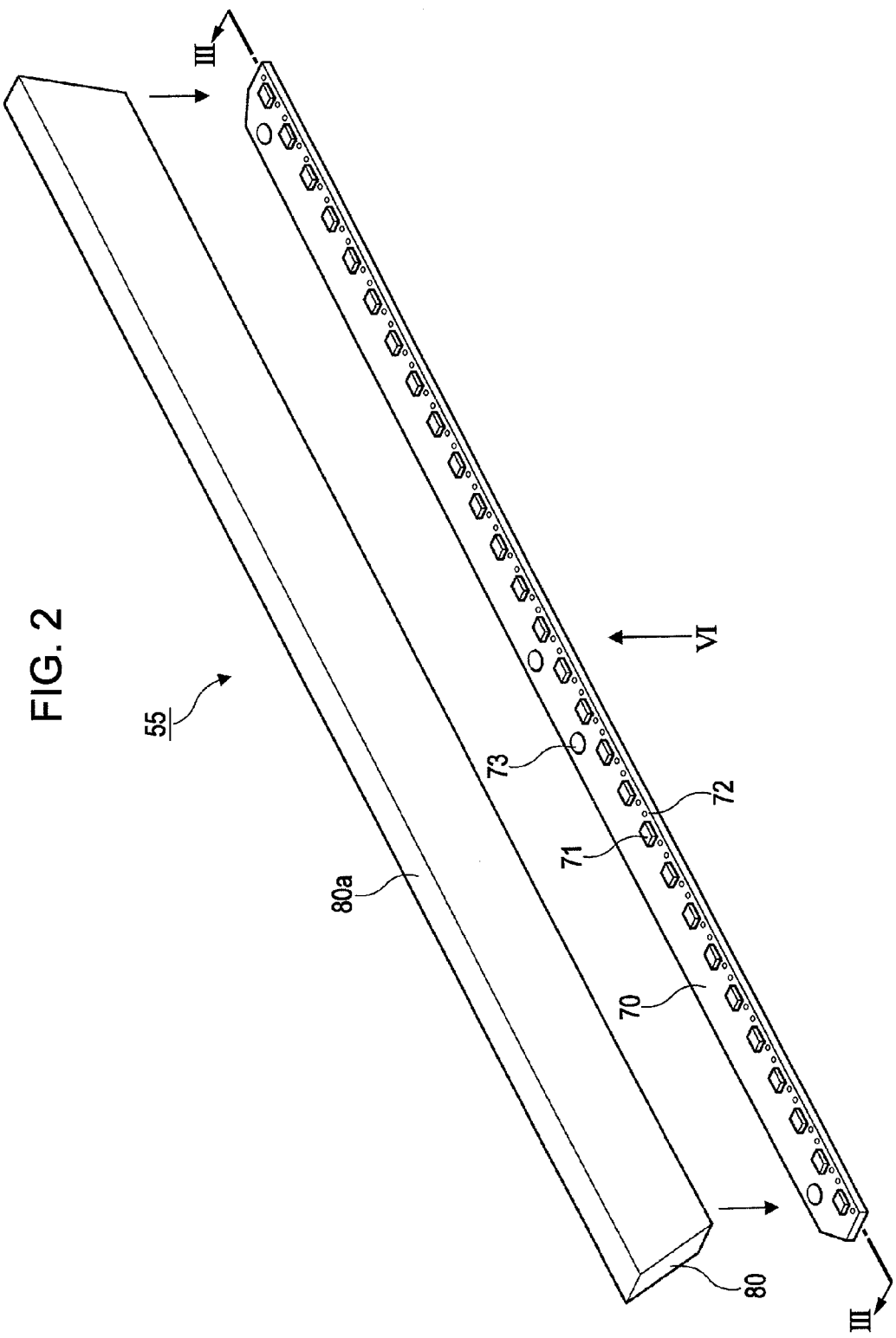
FIG. 2 illustrates a light source according to the exemplary embodiment.

FIG. 2 illustrates the light source 55 according to the exemplary embodiment.

As illustrated in FIG. 2, the light source 55 includes light emitting diode (LED) chips 71, pairs of through holes 72, an attachment hole 73, and a light guide plate 80. The LED chips 71 are examples of light emitting elements linearly arranged on a multilayer substrate 70. The pairs of through holes 72 are formed so that each of the LED chips 71 is interposed between a pair of the through holes 72. The attachment hole 73 is formed in the multilayer substrate 70 and used for attaching the light source 55 thereto. The light guide plate 80, which is disposed in the direction in which the LED chips 71 emit light, guides the light from the LED chips 71 and radiates the light with a predetermined distribution.

The multilayer substrate 70 according to the exemplary embodiment is a glass epoxy substrate, which includes a stack of single layer substrates. Wiring, which is made of a film of metal such as copper, is formed on a surface of the multilayer substrate 70 on which the LED chips 71 are arranged (front surface), on a surface opposite the front surface (back surface), and between the single layer substrates.

The LED chips 71 include GaN-based semiconductor layers and generate blue light. The color of the light is changed to white by phosphor applied to surface of the LED chips 71. The LED chips 71 are linearly arranged on the multilayer substrate 70 in the main scanning direction at approximately equal distances.

The through holes 72 are formed in pairs so that each of the LED chips 71 is interposed between a pair of the through holes 72. A metal film made of copper or the like is formed on the inner surface of each of the through holes 72.

The light guide plate 80, which is made of transparent resin such as acrylic resin, is disposed in the direction in which the LED chips 71 emit light, and guides the light. A filter (not shown) is disposed on an emission surface 80a through which light exits from the light guide plate 80. A projection/recess structure having a predetermined pattern is formed on the filter. The projection/recess structure can provide light that passes therethrough with a predetermined light distribution. The light guide plate 80 is attached to the multilayer substrate 70 with a predetermined distance therebetween using mounting hardware (not shown).

<Description of Multilayer Substrate and Through Hole>

Figure 3:
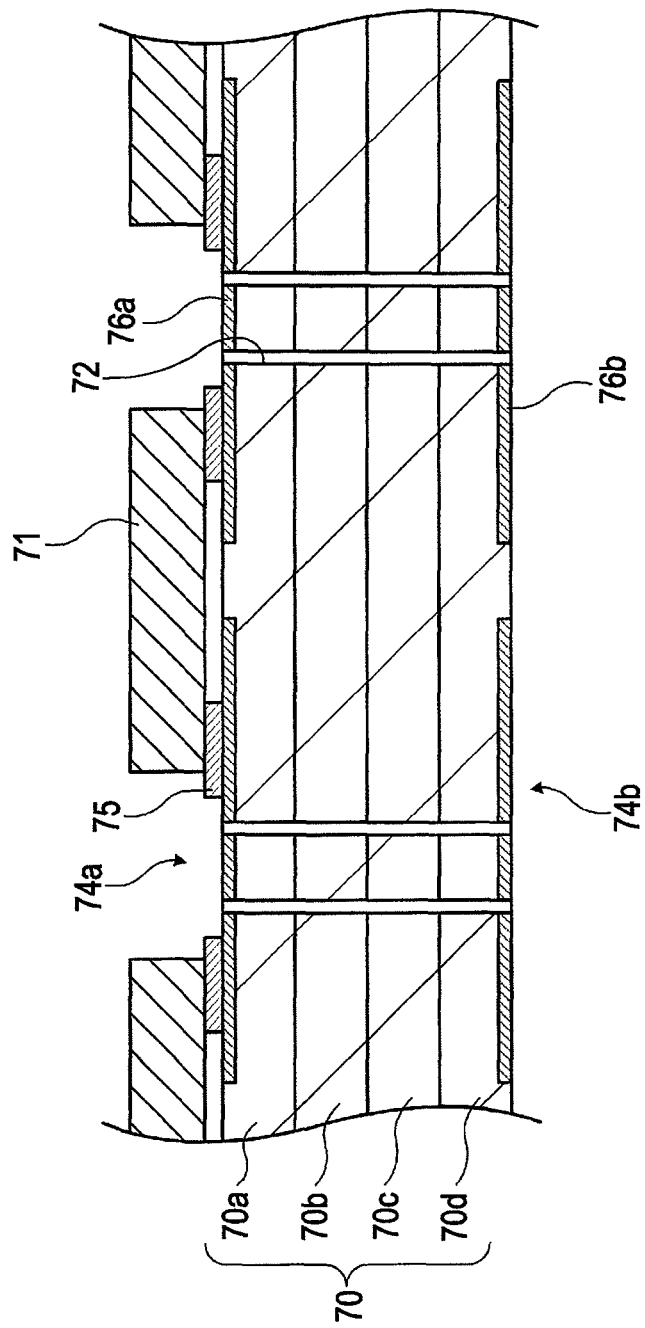
FIG. 3 is a sectional view taken along line III-III of FIG. 2, which illustrates a first example of the structure of a multilayer substrate and through holes.

FIG. 3 is a sectional view taken along line III-III of FIG. 2, which illustrates a first example of the structure of the multilayer substrate 70 and the through holes 72.

The multilayer substrate 70 illustrated in FIG. 3 has a four-layer structure including four single layer substrates 70a, 70b, 70c, and 70d that are stacked on top of one another. The LED chips 71 are attached to a surface 74a of the multilayer substrate 70 with mounts 75 therebetween. Wiring 76a made of a film of metal such as copper is disposed on the surface 74a. The wiring 76a is connected to an anode or a cathode of the LED chip 71, which are electrodes for driving the LED chip 71, through the mount 75, which is conductive.

In the exemplary embodiment, the LED chips 71 are grouped into, for example, groups of five or six LED chips 71. The LED chips 71 that are adjacent to one another in each group are connected to one another through the wiring 76a. That is, the wiring 76a connects the LED chips 71 in each group in series. Thus, at least the LED chips 71 in the same group are simultaneously switched on and off. With such a structure, the wiring pattern can be easily formed and the wiring can be made in a small area.

In the exemplary embodiment, the through holes 72 are formed in the wiring 76a. The through holes 72 extend through the multilayer substrate 70 from the surface 74a, on which the LED chips 71 are arranged, to a surface 74b opposite the surface 74a.

A metal film is formed on the inner surface of each of the through holes 72. The metal film may be made of a material having a high heat conductivity, such as copper. The metal film contacts the wiring 76a disposed on the surface 74a and wiring 76b disposed on the surface 74b.

By thus forming the through holes 72 in the exemplary embodiment, the strength of the multilayer substrate 70 is increased. That is, the metal films on the inner surfaces of the through holes 72 act as reinforcement members, so that the multilayer substrate 70 is more resistant to a bending stress and a torsional stress applied thereto. The metal films formed on the inner surfaces of the through holes 72 are connected to the LED chips 71 through the mounts 75 and the wiring 76a, so that heat generated in the LED chips 71 is transferred to the through holes 72. Moreover, the through holes 72 contact the wiring 76b, so that the heat that has been transferred to the through holes 72 is further transferred to the wiring 76b, and the wiring 76b efficiently dissipates the heat. That is, the wiring 76b serves as a heat dissipating layer. The wiring 76a also serves as a heat dissipating layer that dissipates the heat. The metal films formed on the inner surfaces of the through holes 72 serve as heat conductive films.

If the LED chips 71 are arranged on the multilayer substrate 70 that does not have the through holes 72 and the multilayer substrate 70 is a glass epoxy substrate as in the exemplary embodiment, heat generated in the LED chips 71 is not efficiently dissipated. Moreover, in the exemplary embodiment, the LED chips 71 are mounted in a high density so as to obtain an appropriate amount of light. As a result, the temperature of the LED chips 71 increases, so that the following occur: (1) The luminous efficacy and the luminance decrease. (2) The chromaticity changes from the initial state of emission, which affects the color differences of an image that is read. (3) The drive voltage of the LED chips 71 decreases sharply, the electric current in the driver IC that drives the LED chips increases, heat is generated, and a malfunction occurs. (4) The temperature of the single layer substrate 70a, on which the LED chips 71 are mounted, and the temperatures of the single layer substrates 70b, 70c, and 70d become different from each other, so that the single layer substrates expand to different degrees. That is, because the temperature of the single layer substrate 70a becomes higher than those of the single layer substrates 70b, 70c, and 70d, the single layer substrate 70a thermally expands to a greater degree than other single layer substrates. As a result, there occurs a problem in that, for example, the wiring connecting the single layer substrates 70a, 70b, 70c, and 70d to one another may break.

In the exemplary embodiment, the multilayer substrate 70 has the through holes 72 and the structure described above, so that the strength of the multilayer substrate 70 is increased. Therefore, occurrence of breakage of wiring described above in (4) is suppressed. Moreover, heat generated in the LED chips 71 can be more efficiently dissipated, so that occurrence of the problems described above in (1) to (4) is reduced.

Figure 4:
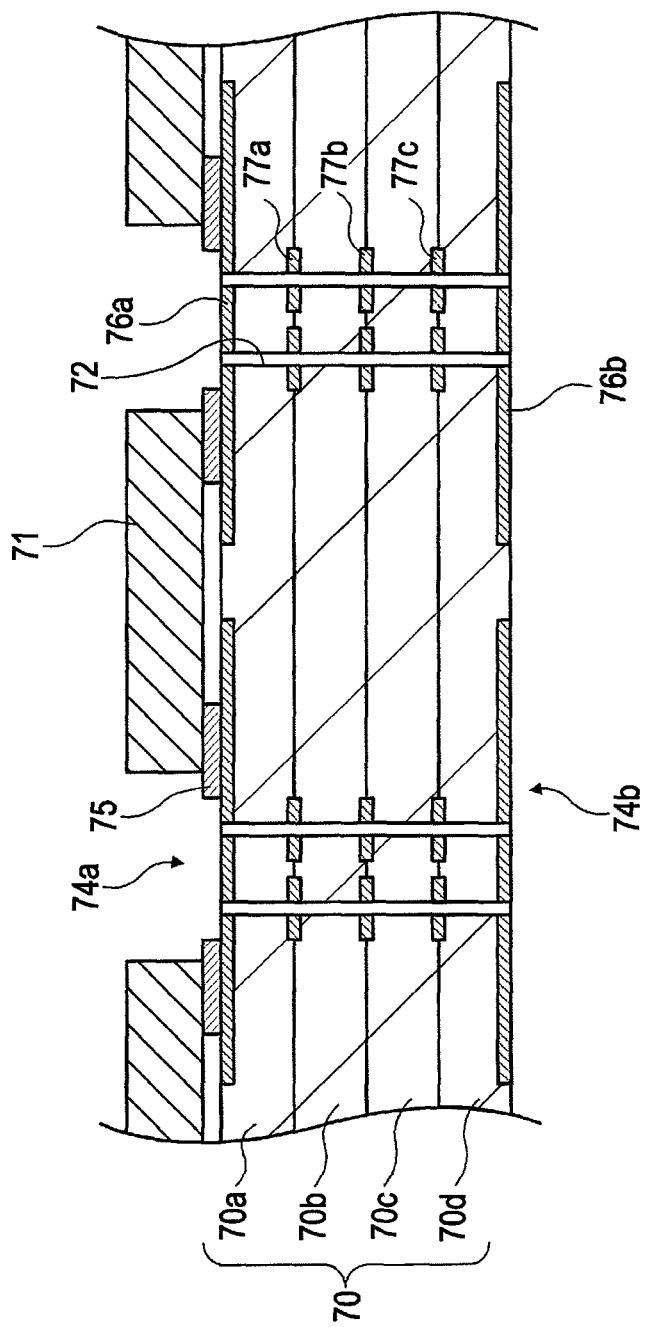
FIG. 4 illustrates a second example of the structure of a multilayer substrate and through holes.

FIG. 4 illustrates a second example of the structure of the multilayer substrate 70 and the through holes 72. As compared with the multilayer substrate 70 illustrated in FIG. 3, the multilayer substrate 70 illustrated in FIG. 4 further includes metal films 77a, 77b, and 77c formed between the single layer substrates 70a, 70b, 70c, and 70d included in the multilayer substrate 70. The metal films 77a, 77b, and 77c and the metal films formed on the inner surfaces of the through holes 72 contact each other. With such a structure, heat generated in the LED chips 71 is transferred to the metal films 77a, 77b, and 77c. The metal films 77a, 77b, and 77c also dissipate the heat, so that the heat dissipation effect of the multilayer substrate 70 is further increased. The metal films 77a, 77b, and 77c serve as heat dissipating layers. The metal films 77a, 77b, and 77c may have approximately equal areas. Thus, the heat dissipation effects of the metal films 77a, 77b, and 77c can be made approximately equal. Therefore, the differences between the temperatures of the single layer substrates 70a, 70b, 70c, and 70d are reduced.

Figure 5:
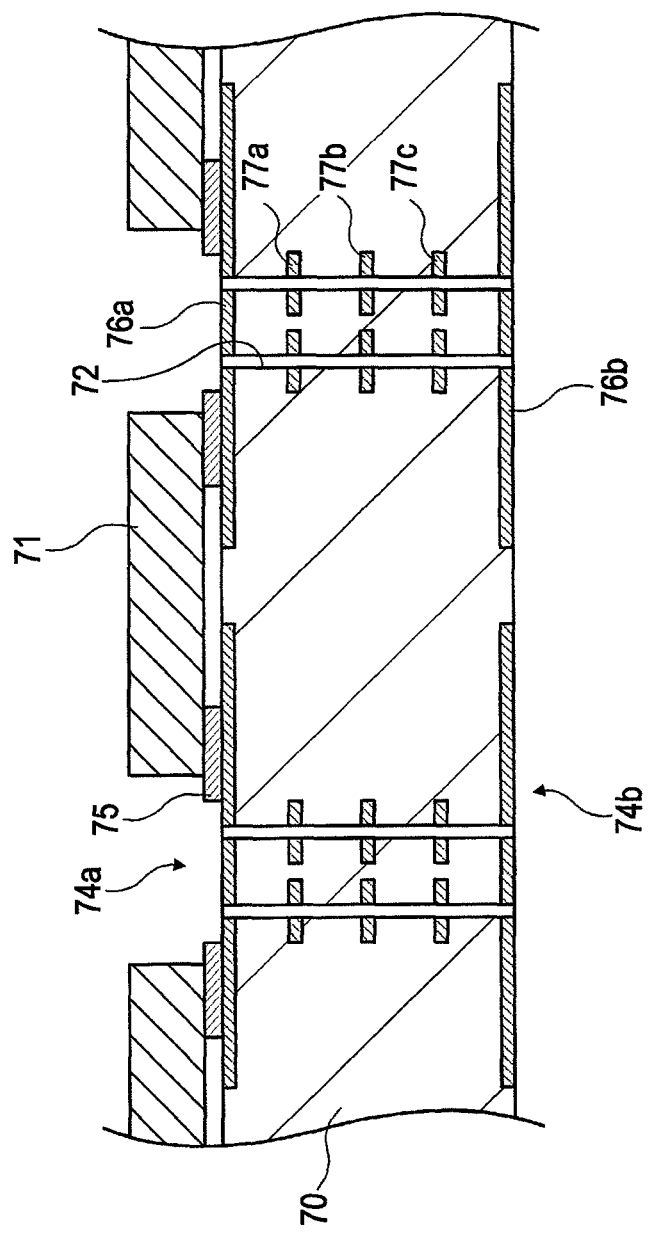
FIG. 5 illustrates a third example of the structure of a multilayer substrate and through holes.

FIG. 5 illustrates a third example of the structure of the multilayer substrate 70 and the through holes 72. In the multilayer substrate 70 illustrated in FIG. 5, the single layer substrates 70a, 70b, 70c, and 70d illustrated in FIG. 4 are formed as a single member, and the metal films 77a, 77b, and 77c are formed in the single member. In the multilayer substrate 70, heat generated in the LED chips 71 is transferred to the metal films 77a, 77b, and 77c and dissipated. That is, the difference in the expansion of the surface 74a on which the LED chip 71 is disposed and the surface 74b opposite the surface 74a is reduced and occurrence of breakage of wiring is suppressed.

<Description of Groove>

Grooves may be formed in parts of the wiring 76a and the wiring 76b.

Figure 6:
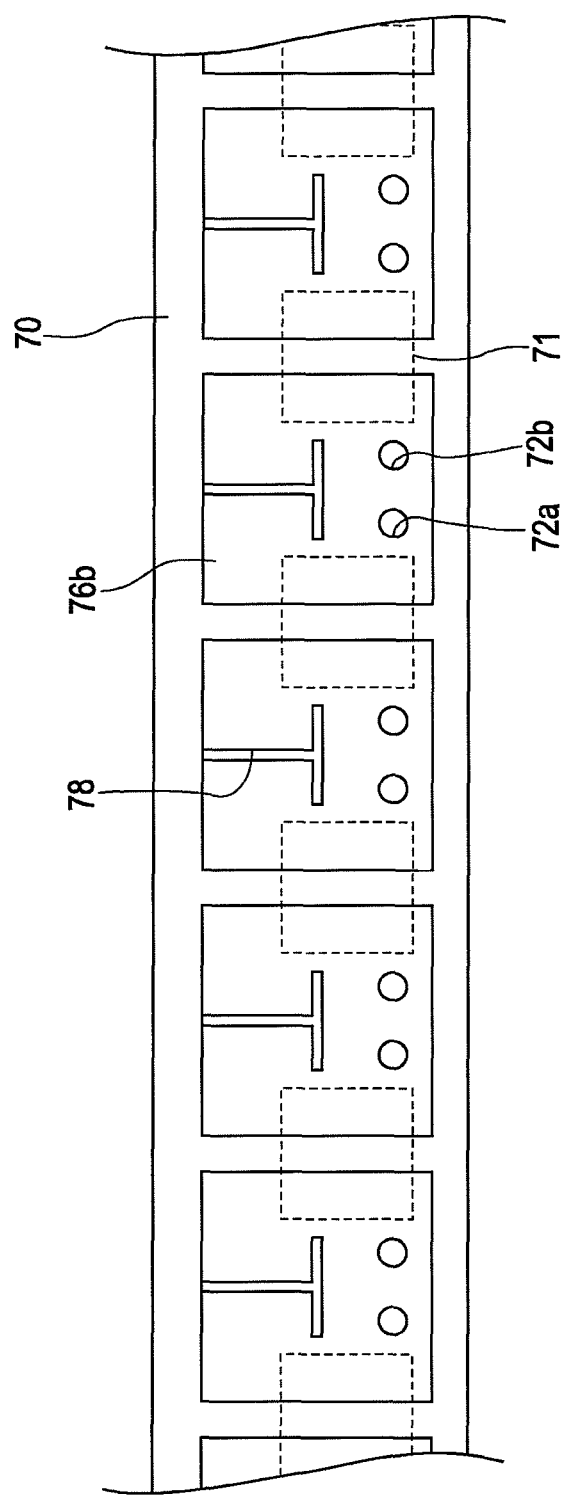
FIG. 6 illustrates the multilayer substrate viewed from the direction VI of FIG. 2.

FIG. 6 illustrates the multilayer substrate 70 viewed from the direction VI of FIG. 2.

As illustrated in FIG. 6, grooves 78, which are T-shaped, are formed in parts of the patterns of the wiring 76b. The wiring 76b is divided at the grooves 78. Because the wiring 76b is not divided at positions other than the groove 78, electrical connection of the pattern of the wiring 76b is maintained.

By forming the groove 78, warping and torsion of the wiring 76b can be suppressed with the glass epoxy resin forming the glass epoxy substrate. Therefore, occurrence of warping and torsion of the wiring 76b is suppressed.

The groove 78 may be formed at a position corresponding to a position between adjacent through holes 72. That is, in FIG. 6, each of the grooves 78 is formed at a position corresponding to a position between the through holes 72a and 72b that are adjacent to each other. Thus, each of the groove 78 is positioned approximately at the center of the pattern of the wiring 76b, so that the wiring is partially divided so as to have a grid-like shape. Therefore, warping and torsion of the wiring 76b can be suppressed more effectively.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. An image reading apparatus comprising:
a light source that irradiates a document with light, the light source comprising:
a Multilayer substrate; and
a plurality of light emitting elements linearly arranged on a first surface of the multilayer substrate; a light receiver that receives reflected light reflected from the document, and metal films formed between single layer substrates included in the multilayer substrate and extending in a direction perpendicular to a direction of the at least a pair of through holes,
wherein the multilayer substrate comprises at least a pair of through holes each having an inner surface on which a reinforcement member is disposed, the at least a pair of through holes being formed so that one of the light emitting elements is interposed therebetween,
wherein each of the reinforcement members contacts a wiring formed on the first surface of the multilayer substrate and another wiring formed on a second surface of the multilayer substrate opposite the first surface, and wherein an entity of the one of the light emitting elements is interposed between the at least a pair of through holes, and
wherein the metal films formed between the single layer substrates and the reinforcement members formed on the inner surfaces of the through holes contact each other.

2. The image reading apparatus according to claim 1, wherein the multilayer substrate is a glass epoxy substrate.

3. The image reading apparatus according to claim 1, wherein the wiring formed on the first surface is connected to an electrode for driving the light emitting elements.

4. The image reading apparatus according to claim 1, wherein the metal films formed between the single layer substrates have approximately equal areas.

5. The image reading apparatus according to claim 1, wherein a groove is formed in a part of the wiring, and the wiring is divided at the groove.

6. The image reading apparatus according to claim 5, wherein the groove is formed at a position corresponding to a position between the through holes that are adjacent to each other.

7. A multilayer substrate use in an image reading apparatus comprising:
a light emitting element; at least a pair of through holes, an inner surface of each of the through holes comprising a reinforcement member; and metal films provided between single layer substrates and extend in a direction perpendicular to a direction of the at least a pair of through holes, wherein the light emitting element is interposed between the at least a pair of through holes, wherein each of the reinforcement members contacts a first wiring provided on a first surface of the multilayer substrate on which the light emitting element is disposed and a second wiring on a second surface of the multilayer substrate opposite the first surface, wherein an entirety of the one of the light emitting elements is interposed between the at least a pair of through holes, and wherein the metal films formed between the single layer substrates and the reinforcement members formed on the inner surfaces of the through holes contact each other.

* * * * *